United States Patent
Ebata

(10) Patent No.: US 12,518,964 B2
(45) Date of Patent: Jan. 6, 2026

(54) METHOD OF MANUFACTURING SEMICONDUCTOR DEVICE, METHOD OF PROCESSING SUBSTRATE, RECORDING MEDIUM, AND SUBSTRATE PROCESSING APPARATUS

(71) Applicant: Kokusai Electric Corporation, Tokyo (JP)

(72) Inventor: Shinya Ebata, Tokyo (JP)

(73) Assignee: Kokusai Electric Corporation, Tokyo (JP)

( * ) Notice: Subject to any disclaimer, the term of this patent is extended or adjusted under 35 U.S.C. 154(b) by 896 days.

(21) Appl. No.: 17/575,352

(22) Filed: Jan. 13, 2022

(65) Prior Publication Data

US 2022/0301852 A1    Sep. 22, 2022

(30) Foreign Application Priority Data

Mar. 17, 2021    (JP) .................................. 2021-044128

(51) Int. Cl.
  *H01L 21/02*    (2006.01)
  *C23C 16/34*    (2006.01)
  (Continued)

(52) U.S. Cl.
  CPC ........ *H01L 21/0228* (2013.01); *C23C 16/345* (2013.01); *C23C 16/45544* (2013.01);
  (Continued)

(58) Field of Classification Search
  CPC ............. H01L 21/0228; H01L 21/0217; H01L 21/02211; H01L 21/02532; C23C 16/345;
  (Continued)

(56) References Cited

U.S. PATENT DOCUMENTS

2009/0170345 A1    7/2009    Akae et al.
2011/0076857 A1    3/2011    Akae et al.
(Continued)

FOREIGN PATENT DOCUMENTS

JP    2010-050425 A    3/2010
JP    2011-097017 A    5/2011
(Continued)

OTHER PUBLICATIONS

Chinese Office Action issued on Jan. 23, 2024 for Chinese Patent Application No. 202210050749.1.
(Continued)

*Primary Examiner* — Latanya N Crawford Eason
(74) *Attorney, Agent, or Firm* — Volpe Koenig

(57) ABSTRACT

There is provided a technique that includes: forming a nitride film containing a predetermined element on a substrate in a process chamber by performing a cycle a predetermined number of times, the cycle including sequentially performing: (a) supplying a first precursor gas containing a molecular structure containing the predetermined element to the substrate with a pressure of the process chamber being set to a first pressure; (b) supplying a second precursor gas, which is different from the first precursor gas and contains a molecular structure containing the predetermined element and not containing a bond between atoms of the predetermined element, to the substrate with the pressure of the process chamber being set to a second pressure higher than the first pressure; and (c) supplying a nitriding agent to the substrate.

23 Claims, 5 Drawing Sheets

(51) Int. Cl.
*C23C 16/455* (2006.01)
*C23C 16/52* (2006.01)

(52) U.S. Cl.
CPC ........ *C23C 16/45553* (2013.01); *C23C 16/52* (2013.01); *H01L 21/0217* (2013.01); *H01L 21/02211* (2013.01)

(58) Field of Classification Search
CPC ........ C23C 16/45544; C23C 16/45553; C23C 16/52; C23C 16/45527; C23C 16/45565
See application file for complete search history.

(56) References Cited

U.S. PATENT DOCUMENTS

| | | | |
|---|---|---|---|
| 2012/0252224 A1* | 10/2012 | Endo | H01L 21/02271 257/E21.279 |
| 2013/0052836 A1 | 2/2013 | Hirose et al. | |
| 2015/0364318 A1 | 12/2015 | Hirose et al. | |
| 2016/0024659 A1 | 1/2016 | Shimamoto et al. | |
| 2017/0221699 A1* | 8/2017 | Orihashi | H01L 21/0245 |
| 2019/0145006 A1* | 5/2019 | Kitamura | C23C 16/4583 438/763 |
| 2019/0157049 A1* | 5/2019 | Sato | C23C 16/45523 |
| 2021/0082685 A1 | 3/2021 | Kataoka et al. | |

FOREIGN PATENT DOCUMENTS

| | | |
|---|---|---|
| JP | 2016-025262 A | 2/2016 |
| SG | 11202008980 Y | 4/2021 |

OTHER PUBLICATIONS

Singapore Search Report issued on May 25, 2023 for Singapore Patent Application No. 10202200402S.
Singapore Written Opinion issued on May 25, 2023 for Singapore Patent Application No. 10202200402S.

* cited by examiner

METHOD OF MANUFACTURING SEMICONDUCTOR DEVICE, METHOD OF PROCESSING SUBSTRATE, RECORDING MEDIUM, AND SUBSTRATE PROCESSING APPARATUS

CROSS-REFERENCE TO RELATED APPLICATION

This application is based upon and claims the benefit of priority from Japanese Patent Application No. 2021-044128, filed on Mar. 17, 2021, the entire contents of which are incorporated herein by reference.

TECHNICAL FIELD

The present disclosure relates to a method of manufacturing a semiconductor device, a method of processing a substrate, a recording medium, and a substrate processing apparatus.

BACKGROUND

In the related art, as a process of manufacturing a semiconductor device, a process of forming a film on a substrate may be carried out.

SUMMARY

Some embodiments of the present disclosure provide a technique capable of forming a film containing a predetermined element (for example, silicon) on a pattern on a substrate with excellent uniformity while suppressing particles containing the predetermined element from being formed on the substrate.

According to some embodiments of the present disclosure, there is provided a technique that includes: forming a nitride film containing a predetermined element on a substrate in a process chamber by performing a cycle a predetermined number of times, the cycle including sequentially performing: (a) supplying a first precursor gas containing a molecular structure containing the predetermined element to the substrate with a pressure of the process chamber being set to a first pressure; (b) supplying a second precursor gas, which is different from the first precursor gas and contains a molecular structure containing the predetermined element and not containing a bond between atoms of the predetermined element, to the substrate with the pressure of the process chamber being set to a second pressure higher than the first pressure; and (c) supplying a nitriding agent to the substrate.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to obscure aspects of the various embodiments.

Embodiments of the Present Disclosure

Embodiments of the present disclosure will be now described mainly with reference to FIGS. 1 to 5. The drawings used in the following description are schematic, and dimensional relationships, ratios, and the like of various elements shown in figures may not match actual ones. Further, dimensional relationships, ratios, and the like of various elements among plural figures do not always match each other.

(1) Configuration of Substrate Processing Apparatus

Figure 1:
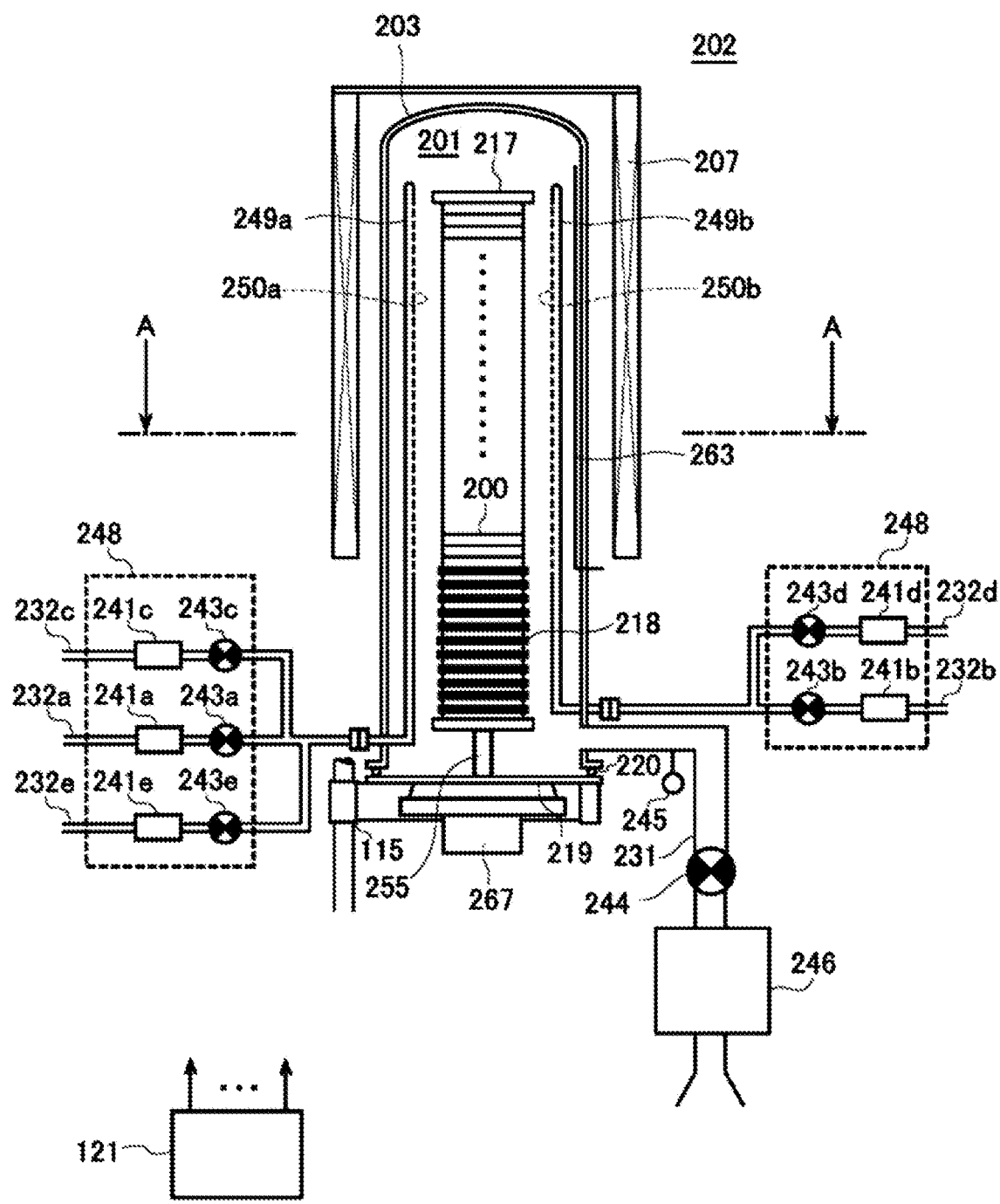
FIG. 1 is a schematic configuration view of a vertical process furnace of a substrate processing apparatus suitably used in embodiments of the present disclosure, in which a portion of the process furnace is shown in a vertical cross section.

As shown in FIG. 1, a process furnace 202 includes a heater 207 as a heating mechanism (a temperature regulator). The heater 207 is formed in a cylindrical shape and is supported by a holding plate to be vertically installed. The heater 207 also functions as an activation mechanism (an exciter) configured to thermally activate (excite) a gas.

A reaction tube 203 is disposed inside the heater 207 to be concentric with the heater 207. The reaction tube 203 is made of, for example, a heat resistant material such as quartz ($SiO_2$) or silicon carbide (SiC), and is formed in a cylindrical shape with its upper end closed and its lower end opened. A process chamber 201 is formed in a hollow cylindrical portion of the reaction tube 203. The process chamber 201 is configured to accommodate a plurality of wafers 200 as substrates. Processing on the wafers 200 is performed in the process chamber 201.

Nozzles 249a and 249b are installed in the process chamber 201 to penetrate through a lower sidewall of the reaction tube 203. Gas supply pipes 232a and 232b are connected to the nozzles 249a and 249b, respectively.

Mass flow controllers (MFCs) 241a and 241b, which are flow rate controllers (flow rate control parts), and valves 243a and 243b, which are opening/closing valves, are installed at the gas supply pipes 232a and 232b, respectively, sequentially from the upstream side of a gas flow. A gas supply pipe 232c is connected to the gas supply pipe 232a at the downstream side of the valve 243a. A MFC 241c and a valve 243c are installed at the gas supply pipe 232c sequentially from the upstream side of a gas flow. Gas supply pipes 232e and 232d are connected to the gas supply pipes 232a and 232b at the downstream side of the valves 243a and 243b, respectively. MFCs 241e and 241d and valves 243e and 243d are installed at the gas supply pipes 232e and 232d, respectively, sequentially from the upstream side of a gas flow.

Figure 2:
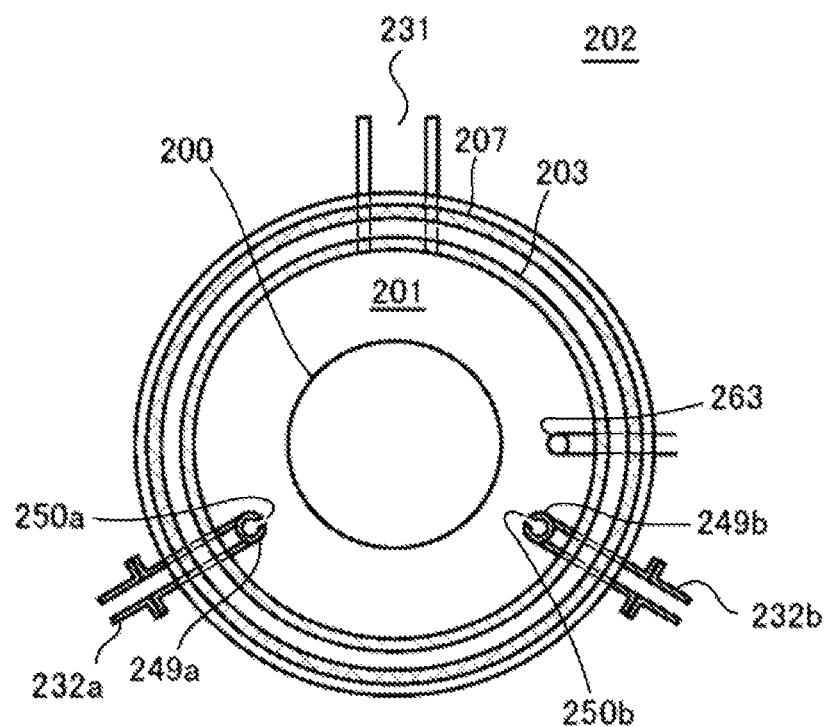
FIG. 2 is a schematic configuration view of the vertical process furnace of the substrate processing apparatus suitably used in embodiments of the present disclosure, in which a portion of the process furnace is shown in a cross section taken along a line A-A in FIG. 1.

As shown in FIG. 2, each of the nozzles 249a and 249b is disposed in an annular space in a plane view between an inner wall of the reaction tube 203 and the wafers 200 to extend upward from a lower portion to an upper portion of the inner wall of the reaction tube 203, that is, along an arrangement direction of the wafers 200. Specifically, each of the nozzles 249a and 249b is installed in a region horizontally surrounding a wafer arrangement region in which the wafers 200 are arranged at a lateral side of the wafer arrangement region, along the wafer arrangement region. Gas supply holes 250a and 250b configured to supply a gas are formed on the side surfaces of the nozzles 249a and 249b, respectively. Each of the gas supply holes 250a and 250b is opened to face the center of the reaction tube 203, which enables a gas to be supplied toward the wafers 200. A plurality of gas supply holes 250a and 250b are formed from the lower portion to the upper portion of the reaction tube 203.

A first precursor gas containing a molecular structure containing a predetermined element, for example, a gas containing silicon (Si) as the predetermined element, is supplied from the gas supply pipe 232a into the process chamber 201 via the MFC 241a, the valve 243a, and the nozzle 249a. The first precursor gas refers to a gaseous precursor, for example, a gas obtained by vaporizing a precursor which remains in a liquid state at room temperature and atmospheric pressure, or a precursor which remains in a gas state at room temperature and atmospheric pressure. The first precursor gas acts as a first source (that is, a first Si source) of the predetermined element in a film-forming process to be described later. Further, a pressure of the process chamber 201 when the first precursor gas is present alone in the process chamber 201 may be referred to as a first pressure.

A second precursor gas which is different from the first precursor gas and contains a molecular structure containing the predetermined element and not containing a bond between atoms of the predetermined element, for example, a gas containing Si as the predetermined element, is supplied from the gas supply pipe 232c into the process chamber 201 via the MFC 241c, the valve 243c, and the nozzle 249a. The second precursor gas acts as a second source (that is, a second Si source) of the predetermined element in the film-forming process to be described later. In the present disclosure, when the second precursor gas is present alone in the process chamber 201, a thermal decomposition temperature of the second precursor gas may be referred to as a second temperature. Here, the thermal decomposition temperature of the second precursor gas may be lower than the thermal decomposition temperature of the first precursor gas. In other words, the energy (dissociation energy) used to decompose gas molecules contained in the second precursor gas into a plurality of chemical structures (molecules or radicals) may be lower than that of the first precursor gas. Further, a pressure of the process chamber 201 when the second precursor gas is present alone in the process chamber 201 may be referred to as a second pressure.

A reaction gas, for example, a nitriding agent (nitriding gas) containing a nitrogen (N) element is supplied from the gas supply pipe 232b into the process chamber 201 via the MFC 241b, the valve 243b, and the nozzle 249b. The nitriding agent acts as a N source in the film-forming process to be described later.

An inert gas is supplied from the gas supply pipes 232d and 232e into the process chamber 201 via the MFCs 241d and 241e, the valves 243d and 243e, the gas supply pipes 232a and 232b, and the nozzles 249a and 249b, respectively. The inert gas acts as a purge gas, a carrier gas, a dilution gas, or the like.

When the gases as mentioned above flow from the gas supply pipes, respectively, a first precursor gas supply system mainly includes the gas supply pipe 232a, the MFC 241a, and the valve 243a. A second precursor gas supply system mainly includes the gas supply pipe 232c, the MFC 241c, and the valve 243c. A reaction gas supply system mainly includes the gas supply pipe 232b, the MFC 241b, and the valve 243b. A nitriding agent supply system mainly includes the gas supply pipe 232b, the MFC 241b, and the valve 243b. An inert gas supply system mainly includes the gas supply pipes 232d and 232e, the MFCs 241d and 241e, and the valves 243d and 243e.

The above-described various supply systems may be configured as an integrated supply system 248 in which the valves 243a to 243e, the MFCs 241a to 241e, and so on are integrated. The integrated supply system 248 is connected to each of the gas supply pipes 232a to 232e. In addition, the integrated supply system 248 is configured such that operations of supplying various gases into the gas supply pipes 232a to 232e (that is, the opening/closing operation of the valves 243a to 243e, the flow rate regulation operation by the MFCs 241a to 241e, and the like) and the like are controlled by a controller 121 which will be described later. The integrated supply system 248 is configured as an integral type or divisional type integrated unit, and may be attached to and detached from the gas supply pipes 232a to 232e and the like on an integrated unit basis, such that the maintenance, replacement, extension, and the like of the integrated supply system 248 may be performed on an integrated unit basis.

The exhaust pipe 231 configured to exhaust an internal atmosphere of the process chamber 201 is installed below the sidewall of the reaction tube 203. A vacuum exhauster, for example, a vacuum pump 246, is connected to the exhaust pipe 231 via a pressure sensor 245, which is a pressure detector (pressure detecting part) configured to detect the internal pressure of the process chamber 201, and an auto pressure controller (APC) valve 244, which is a pressure regulator (pressure regulating part). The APC valve 244 is configured to be capable of performing or stopping a vacuum exhausting operation in the process chamber 201 by opening/closing the valve while the vacuum pump 246 is actuated, and is also configured to be capable of regulating the internal pressure of the process chamber 201 by adjusting an opening state of the valve based on pressure information detected by the pressure sensor 245 while the vacuum pump 246 is actuated. An exhaust system mainly includes the exhaust pipe 231, the pressure sensor 245, and the APC valve 244. The exhaust system may include the vacuum pump 246.

A seal cap 219, which serves as a furnace opening lid configured to be capable of hermetically sealing a lower end opening of the reaction tube 203, is installed under the reaction tube 203. The seal cap 219 is made of, for example, a metal material such as SUS, and is formed in a disc shape. An O-ring 220, which is a seal making contact with the lower end of the reaction tube 203, is installed on an upper surface of the seal cap 219. A rotator 267 configured to rotate a boat 217, which will be described later, is installed under the seal cap 219. A rotary shaft 255 of the rotator 267 is connected to the boat 217 through the seal cap 219. The rotator 267 is configured to rotate the wafers 200 by rotating the boat 217. The seal cap 219 is configured to be vertically moved up or down by a boat elevator 115 which is an elevating mechanism installed outside the reaction tube 203. The boat elevator 115 is configured as a transfer device (transfer mechanism) configured to loads/unloads (transfers) the wafers 200 into/out of the process chamber 201 by moving the seal cap 219 up or down.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of, for example, a heat resistant material such as quartz or SiC. Heat insulating plates 218 made of, for example, a heat resistant material such as quartz or SiC are supported in a horizontal posture below the boat 217 in multiple stages.

A temperature sensor 263 serving as a temperature detector is installed in the reaction tube 203. Based on temperature information detected by the temperature sensor 263, a state of supplying electric power to the heater 207 is regulated such that a temperature distribution in the process chamber 201 becomes a desired temperature distribution. The temperature sensor 263 is installed along the inner wall of the reaction tube 203.

Figure 3:
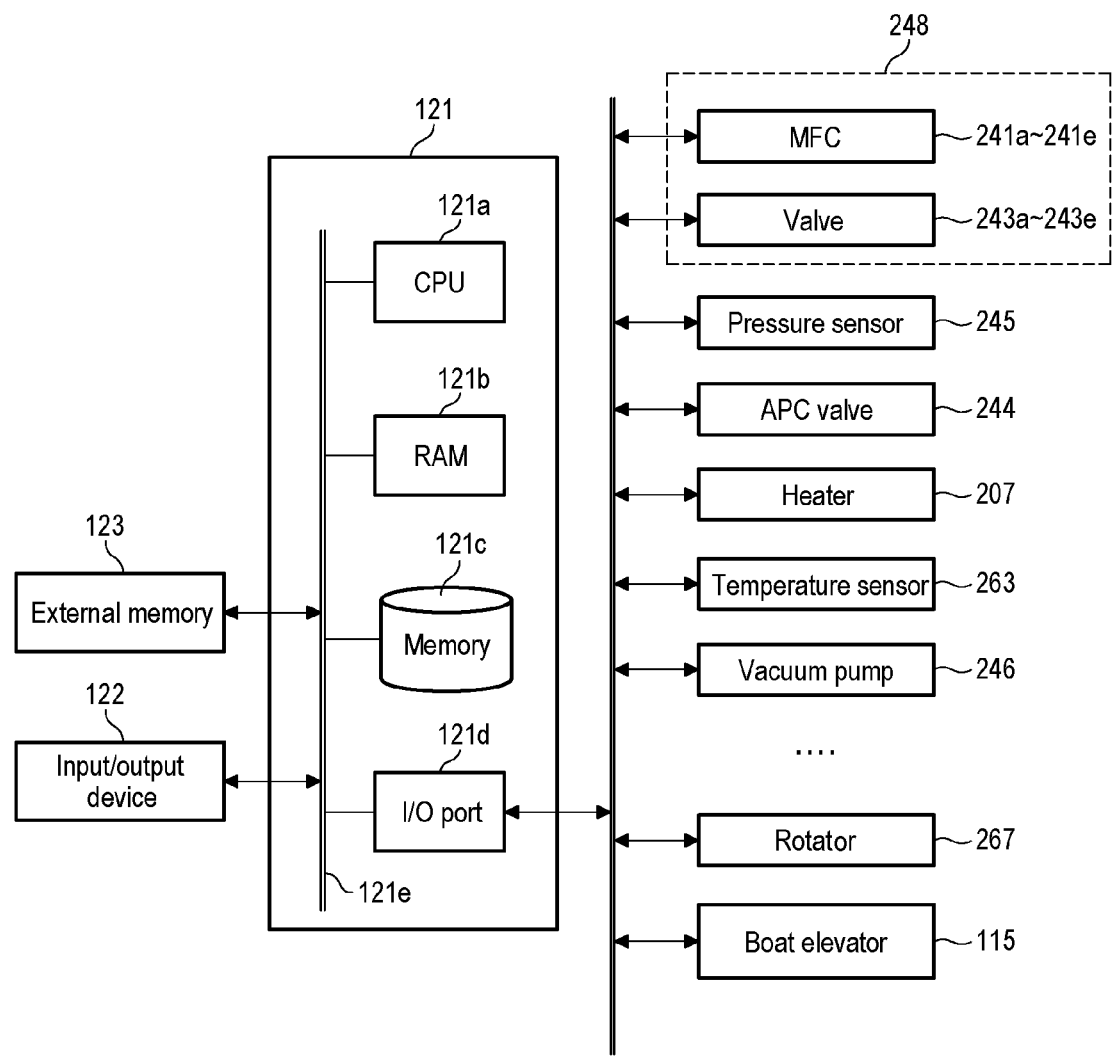
FIG. 3 is a schematic configuration diagram of a controller of the substrate processing apparatus suitably used in embodiments of the present disclosure, in which a control system of the controller is shown in a block diagram.

As shown in FIG. 3, a controller 121, which is a control part (control unit or control means), may be configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 including, e.g., a touch panel or the like, is connected to the controller 121.

The memory 121c includes, for example, a flash memory, a hard disc drive (HDD), or the like. A control program that controls operations of a substrate processing apparatus, a process recipe in which sequences and conditions of a film-forming process to be described later are written, etc. are readably stored in the memory 121c. The process recipe functions as a program that causes the controller 121 to execute each sequence in the film-forming process, which will be described later, to obtain an expected result. Hereinafter, the process recipe and the control program may be generally and simply referred to as a "program."

An example of the above-mentioned program may include a program that causes, by a computer, a substrate processing apparatus to perform a process including:
  (a) supplying a first precursor gas containing a molecular structure containing the predetermined element to the substrate with a pressure of the process chamber (201) being set to a first pressure;
  (b) supplying a second precursor gas, which is different from the first precursor gas and contains a molecular structure containing the predetermined element and not containing a bond between atoms of the predetermined element, to the substrate with the pressure of the process chamber (201) being set to a second pressure higher than the first pressure; and
  (c) supplying a nitriding agent to the substrate.

Furthermore, the process recipe may be simply referred to as a "recipe." When the term "program" is used herein, it may indicate a case of including the recipe, a case of including the control program, or a case of including both the recipe and the control program. The RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the temperature sensor 263, the heater 207, the rotator 267, the boat elevator 115, and so on.

The CPU 121a is configured to read and execute the control program from the memory 121c. The CPU 121a is also configured to read the recipe from the memory 121c according to an input of an operation command from the input/output device 122. The CPU 121a is configured to be capable of controlling the flow rate regulating operation of various kinds of gases by the MFCs 241a to 241e, the opening/closing operation of the valves 243a to 243e, the opening/closing operation of the APC valve 244, the pressure regulating operation performed by the APC valve 244 based on the pressure sensor 245, the actuating and stopping operation of the vacuum pump 246, the temperature regulating operation performed by the heater 207 based on the temperature sensor 263, the operation of rotating the boat 217 with the rotator 267 and adjusting the rotation speed of the boat 217, the operation of moving the boat 217 up or down by the boat elevator 115, and so on, according to contents of the read recipe.

The controller 121 may be configured by installing, on the computer, the aforementioned program stored in the external memory 123. Examples of the external memory 123 may include a magnetic disc such as a HDD, an optical disc such as a CD, a magneto-optical disc such as a MO, a semiconductor memory such as a USB memory, and the like. The memory 121c or the external memory 123 is configured as a computer-readable recording medium. Hereinafter, the memory 121c and the external memory 123 may be generally and simply referred to as a "recording medium." When the term "recording medium" is used herein, it may indicate a case of including the memory 121c, a case of including the external memory 123, or a case of including both the memory 121c and the external memory 123. Furthermore, the program may be provided to the computer by using a communication means or communication unit such as the Internet or a dedicated line, instead of using the external memory 123.

To summarize the above, the substrate processing apparatus of embodiments of the present disclosure includes:
  a process chamber (201) in which a substrate is accommodated;
  a first precursor gas supply system configured to supply a first precursor gas containing a molecular structure containing a predetermined element into the process chamber (201);
  a second precursor gas supply system configured to supply a second precursor gas, which is different from the first precursor gas and contains a molecular structure containing the predetermined element and not containing a bond between atoms of the predetermined element, into the process chamber (201);
  a nitriding agent supply system configured to supply a nitriding agent into the process chamber (201); and
  a controller configured to be capable of controlling the first precursor gas supply system, the second precursor gas supply system, and the nitriding agent supply system to perform a process including: forming a nitride film containing the predetermined element on the substrate in the process chamber (201) by performing a cycle a predetermined number of times, the cycle including sequentially and non-simultaneously performing: (a) supplying the first precursor gas to the substrate with a pressure of the process chamber (201) being set to a first pressure; (b) supplying the second precursor gas to the substrate with the pressure of the process chamber (201) being set to a second pressure higher than the first pressure; and (c) supplying the nitriding agent to the substrate.

(2) Substrate Processing Process

As a process of manufacturing a semiconductor device by using the above-described substrate processing apparatus, a substrate processing sequence example of forming a film on a wafer 200 as a substrate, that is, a film-forming sequence example, will be described with reference to FIGS. 4 and 5. In the following descriptions, the operations of the respective components constituting the substrate processing apparatus are controlled by the controller 121.

A method of manufacturing a semiconductor device as the process described above includes:

forming a nitride film containing a predetermined element on a substrate in a process chamber (201) by performing a cycle a predetermined number of times, the cycle including sequentially and non-simultaneously performing:
(a) a step of supplying a first precursor gas containing a molecular structure containing the predetermined element to the substrate with a pressure of the process chamber (201) being set to a first pressure;
(b) a step of supplying a second precursor gas, which is different from the first precursor gas and contains a molecular structure containing the predetermined element and not containing a bond between atoms of the predetermined element, to the substrate with the pressure of the process chamber (201) being set to a second pressure higher than the first pressure; and
(c) a step of supplying a nitriding agent to the substrate.

Figure 4:
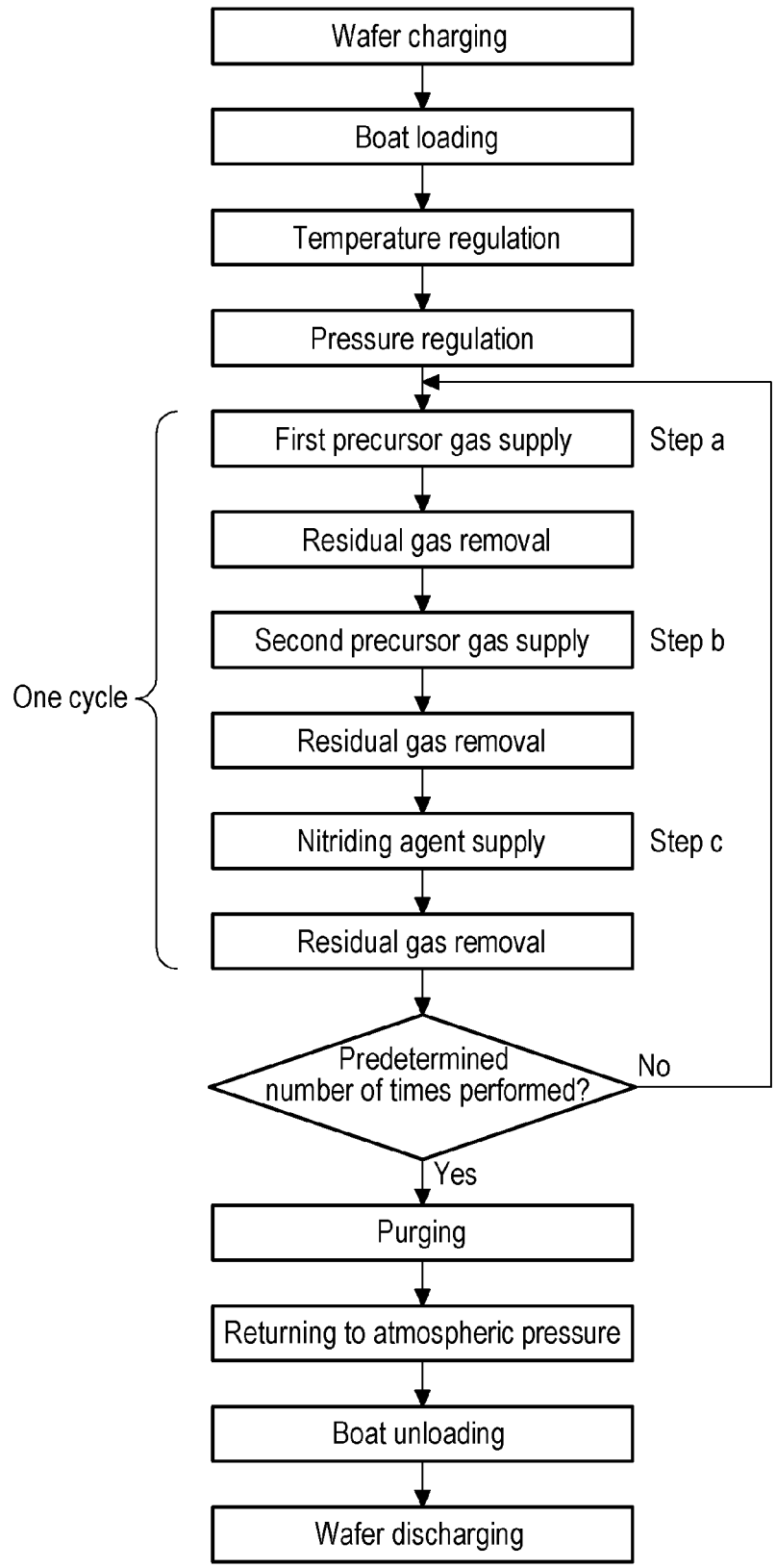
FIG. 4 is a view showing a flow in a substrate processing process of embodiments of the present disclosure.
Figure 5:
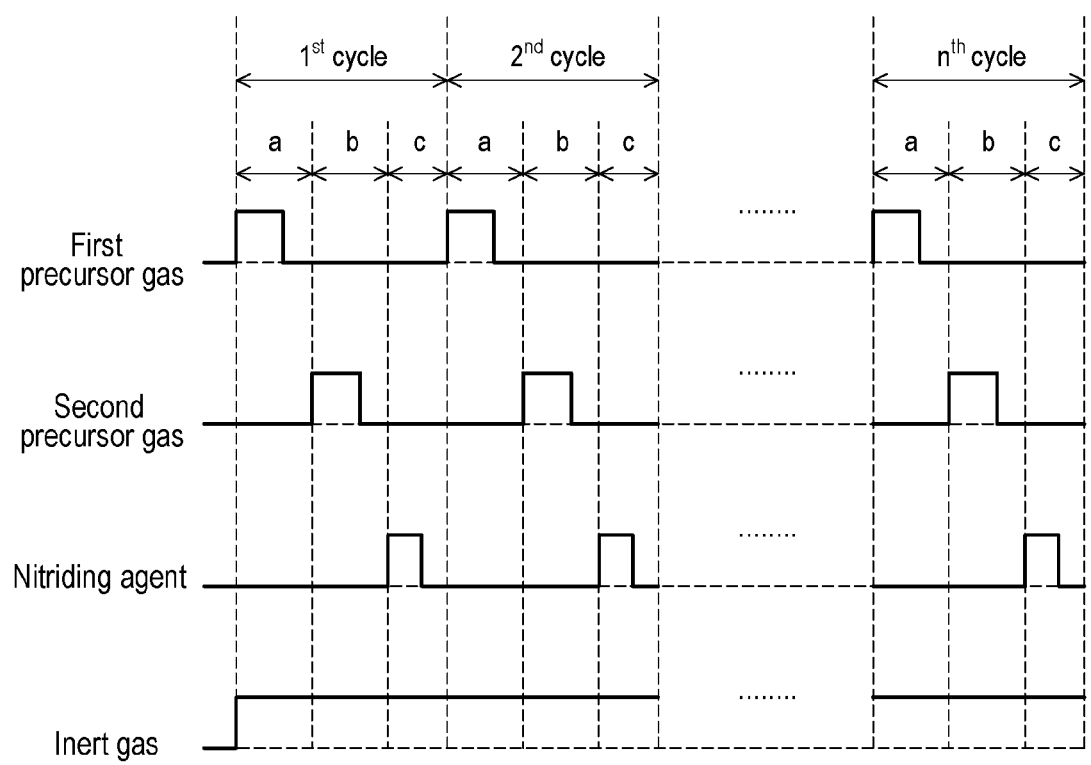
FIG. 5 is a diagram showing gas supply timings in a film-forming process of embodiments of the present disclosure.

In a film-forming sequence shown in FIGS. 4 and 5, a silicon nitride film (SiN film) is formed as a film containing predetermined elements Si and N on a wafer 200 in a process chamber 201 by performing a cycle a predetermined number of times (n times, where n is an integer of 1 or more), the cycle that includes sequentially performing: step a of supplying a first precursor gas as a Si source to the wafer 200; step b of supplying a second precursor gas as a Si source to the wafer 200; and step c of supplying a nitriding agent to the wafer 200. In FIG. 5, performance periods of steps a, b, and c are represented as a, b, and c, respectively.

In the present disclosure, for the sake of convenience, the film-forming sequence illustrated in FIGS. 4 and 5 may be denoted as follows. The same denotation may be used in other embodiments to be described later.

(First precursor gas→Second precursor gas→Nitriding agent)×n⇒Nitride film

When the term "wafer" is used in the present disclosure, it may refer to "a wafer itself" or "a wafer and a stacked body of certain layers or films formed on a surface of the wafer." When the phrase "a surface of a wafer" is used in the present disclosure, it may refer to "a surface of a wafer itself" or "a surface of a certain layer and the like formed on a wafer." When the expression "a certain layer is formed on a wafer" is used in the present disclosure, it may mean that "a certain layer is formed directly on a surface of a wafer itself" or that "a certain layer is formed on a layer and the like formed on a wafer." When the term "substrate" is used in the present disclosure, it may be synonymous with the term "wafer."

(Wafer Charging and Boat Loading)

The boat 217 is charged with a plurality of wafers 200 (wafer charging). After that, as shown in FIG. 1, the boat 217 charged with the plurality of wafers 200 is lifted up by the boat elevator 115 to be loaded into the process chamber 201 (boat loading). In this state, the seal cap 219 seals the lower end of the reaction tube 203 via the O-ring 220.

(Pressure Regulation and Temperature Regulation)

The interior of the process chamber 201, that is, a space where the wafers 200 are placed, is vacuum-exhausted (decompression-exhausted) by the vacuum pump 246 to reach a desired processing pressure (degree of vacuum). At this time, the internal pressure of the process chamber 201 is measured by the pressure sensor 245, and the APC valve 244 is feedback-controlled based on the measured pressure information. Further, the wafers 200 in the process chamber 201 are heated by the heater 207 to have a desired processing temperature (film formation temperature). At this time, a state of supplying electric power to the heater 207 is feedback-controlled based on the temperature information detected by the temperature sensor 263 so that a temperature distribution in the process chamber 201 becomes a desired temperature distribution. Further, the rotation of the wafers 200 by the rotator 267 is started. The operation of the vacuum pump 246 and the heating and rotation of the wafers 200 are continuously performed at least until the processing on the wafers 200 is completed. The above-mentioned processing temperature means the temperature of the wafers 200, and the above-mentioned processing pressure means the internal pressure of the process chamber 201. The same applies to the following description.

(Film-Forming Process)

After that, the following steps a to c are performed sequentially.

[Step a]

In this step, a first precursor gas is supplied to the wafer 200 in the process chamber 201. Specifically, the valve 243a is opened to allow the first precursor gas to flow through the gas supply pipe 232a. A flow rate of the first precursor gas is regulated by the MFC 241a, and the first precursor gas is supplied into the process chamber 201 via the nozzle 249a and is exhausted via the exhaust pipe 231. In this operation, the first precursor gas is supplied to the wafer 200. At the same time, the valve 243e is opened to allow an inert gas to flow into the gas supply pipe 232e. A flow rate of the inert gas is regulated by the MFC 241e. The inert gas with the regulated flow rate is supplied into the process chamber 201, together with the first precursor gas, and is exhausted via the exhaust pipe 231.

A process condition in this step is exemplified as follows.
First precursor gas supply flow rate (first flow rate): 1 to 2,000 sccm, specifically 100 to 1,000 sccm
Inert gas supply flow rate: 100 to 20,000 sccm
Each gas supply time: 10 to 300 seconds, specifically 10 to 120 seconds
Processing temperature: 400 to 800 degrees C., specifically 500 to 800 degrees C., more specifically 600 to 750 degrees C.
Processing pressure (first pressure): 1 to 1,300 Pa, specifically 10 to 260 Pa In the present disclosure, notation of a numerical range such as "400 to 800 degrees C." means that a lower limit value and an upper limit value are included in the range. Therefore, "400 to 800 degrees C." means "equal to or higher than 400 degrees C. and equal to or lower than 800 degrees C." The same applies to other numerical ranges.

In the present embodiment, as a pretreatment of this step, a pre-flow of supplying a hydrogen nitride gas to the wafer 200 in advance is performed. By supplying the hydrogen nitride gas to the wafer 200 in the pre-flow, an adsorption site by hydrogen (H) is formed on the surface of the wafer 200, such that Si atoms are easily adsorbed (that is, reactivity with the Si atoms is high) in this step or step b to be described later. The procedure of the pre-flow may be performed, for example, in the same manner as in step c to be described later. As the hydrogen nitride gas, the same gas as the nitriding agent used in step c may be used.

Under the aforementioned condition, when a chlorosilane gas is used as the first precursor gas, some of Si—Cl bonds in the first precursor gas are cut, such that Si having a dangling bond may be adsorbed on the adsorption site of the surface of the wafer 200. Further, under the aforementioned condition, Si—Cl bonds not cut in the first precursor gas may be held as they are. For example, when a tetrachlorosilane ($SiCl_4$) gas is used as the first precursor gas, in a state where Cl is bonded to each of three of four bonding hands of Si constituting the first precursor gas, Si having the dangling bond may be adsorbed on the adsorption site of the surface of the wafer 200. Further, since Cl held without being cut from Si adsorbed on the surface of the wafer 200 inhibits other Si having the dangling bond from being bonded to this Si, it is possible to avoid multiple deposits of Si on the wafer 200. Cl separated from Si constitutes a gaseous substance such as HCl or $Cl_2$, which is exhausted via the exhaust pipe 231. When an adsorption reaction of Si proceeds and there are no adsorption site remaining on the surface of the wafer 200, the adsorption reaction is saturated. This step may be completed with the adsorption site remaining by stopping the supply of the first precursor gas before the adsorption reaction is saturated.

As a result, when the chlorosilane gas is used as the first precursor gas, a layer containing Si and Cl having substantially a uniform thickness of less than one atomic layer, that is, a Si-containing layer containing Cl, is formed as a first layer on the wafer 200. Here, a layer having a thickness of less than one atomic layer means an atomic layer formed discontinuously, and a layer having a thickness of one atomic layer means an atomic layer formed continuously. Further, the fact that a layer having a thickness of less than one atomic layer is substantially uniform means that atoms are adsorbed on the surface of the wafer 200 at substantially a uniform density. Since the first layer is formed with substantially a uniform thickness on the wafer 200, step coverage characteristics and wafer in-plane film thickness uniformity are excellent.

When the processing temperature is lower than 400 degrees C., Si may be difficult to be adsorbed on the wafer 200, which may make it difficult to form the first layer. By setting the processing temperature to 400 degrees C. or higher, it is possible to form the first layer on the wafer 200. By setting the processing temperature to 500 degrees C. or higher, the above-described effects may be obtained reliably. By setting the processing temperature to 600 degrees C. or higher, the above-described effects may be obtained more reliably.

When the processing temperature exceeds 800 degrees C., it is difficult to hold the Si—Cl bond not cut in the first precursor gas as it is, and a thermal decomposition rate of the first precursor gas increases. As a result, Si is multi-deposited on the wafer 200, which may make it difficult to form a Si-containing layer having substantially a uniform thickness of less than one atomic layer, as the first layer. By setting the processing temperature to 800 degrees C. or lower, it is possible to form a Si-containing layer having substantially a uniform thickness of less than one atomic layer, as the first layer. By setting the processing temperature to 750 degrees C. or lower, the above-described effects may be obtained reliably.

At this time, in step a, that a predetermined element-containing layer (a first layer) is discontinuously formed on the substrate surface. That is, by forming the first layer discontinuously in step a, an adsorption site on the substrate surface on which a second precursor gas may be adsorbed in step b to be described later may be left, such that formation of a second layer by supply of the second precursor gas may be promoted. Further, in step a, a coverage of the predetermined element-containing layer (the first layer) on the substrate surface may be less than 70%. Here, when the coverage of the first layer is 70% or more, it may be difficult to make the ratio of the predetermined element in the nitride film higher than the stoichiometric composition ratio by supplying the second precursor gas in step b to be described later. Therefore, by setting the coverage of the first layer to be less than 70%, it is easy to increase the ratio of the predetermined element in the nitride film by supplying the second precursor gas in step b to be described later. Further, in step a, the coverage of the predetermined element-containing layer on the substrate surface may be more than 30%. Here, when the coverage of the first layer is 30% or less, the effect of suppressing the adsorption of the second precursor gas on the substrate surface is hardly obtained when the second precursor gas is supplied in step b to be described later, which may make it difficult to form the second layer while maintaining the uniformity of thickness in the first layer. Therefore, by making the coverage of the first layer more than 30%, the adsorption of the second precursor gas on the substrate surface is suppressed when the second precursor gas is supplied in step b to be described later, which makes it easy to form the second layer while maintaining the uniformity of thickness in the first layer.

After forming the first layer on the wafer 200, the valve 243*a* is closed to stop the supply of the first precursor gas into the process chamber 201. Then, the interior of the process chamber 201 is vacuum-exhausted to remove a gas and the like remaining in the process chamber 201 from the process chamber 201. At this time, the valves 243*d* and 243*e* are left open to maintain the supply of the inert gas into the process chamber 201. The inert gas acts as a purge gas, whereby the effect of removing the gas and the like remaining in the process chamber 201 from the process chamber 201 may be enhanced.

As the first precursor gas, for example, a halosilane-based gas containing Si as a predetermined element and a halogen element may be suitably used. Halosilane is silane containing a halogen group. The halogen group includes a chloro group, a fluoro group, a bromo group, an iodine group, and the like. That is, the halogen group contains halogen elements such as chlorine (Cl), fluorine (F), bromine (Br), and iodine (I). As the halosilane-based gas, for example, a precursor gas containing Si and Cl, that is, a chlorosilane-based gas, may be used. As the first precursor gas, a chlorosilane gas containing one Si atom contained in one molecule may be used.

Here, the first precursor gas may contain a molecular structure containing a halogen element bonded to an atom of a predetermined element. That is, the halogen element bonded to the atom of the predetermined element of the first precursor gas forms a halogen (for example, Cl) termination in the first layer. The first layer containing this halogen termination has the effect of suppressing the adsorption of the second precursor gas on the substrate surface, such that even when there is unevenness in the supply of the second precursor gas, the second precursor gas is easily evenly adsorbed. In this case, the first precursor gas may contain a molecular structure in which hydrogen is not bonded to the atom of the predetermined element. As such a first precursor gas, a halosilane gas, specifically a chlorosilane gas, may be used.

As the first precursor gas, for example, a halosilane precursor gas such as a $SiCl_4$ gas, a monochlorosilane ($SiH_3Cl$) gas, a dichlorosilane ($SiH_2Cl_2$) gas, or a trichlorosilane ($SiHCl_3$) gas may be used. Further, as the first precursor gas, in addition to the chlorosilane-based gas, it may be possible to use, e.g., a fluorosilane-based gas such as a tetrafluorosilane ($SiF_4$) gas, a bromosilane-based gas such as a tetrabromosilane ($SiBr_4$) gas, an iodosilane-based gas such as a tetraiodosilane ($SiI_4$) gas, or the like. One or more of these gases may be used as the first precursor gas. However, as the first precursor gas, a gas different from the second precursor gas is selected. Further, the first precursor gas may be selected from gases of a higher thermal decomposition temperature (gases of higher dissociation energy) than that of the second precursor gas.

As the inert gas, a rare gas such as a nitrogen ($N_2$) gas, an argon (Ar) gas, a helium (He) gas, a neon (Ne) gas, or a xenon (Xe) gas may be used. One or more of these gases may be used as the inert gas. This point is the same in steps b and c to be described later.

[Step b]

In this step, a second precursor gas is supplied to the wafer 200 in the process chamber 201, that is, the first layer formed on the wafer 200. Specifically, the valve 243c is opened to allow the second precursor gas to flow into the gas supply pipe 232a. The flow rate of the second precursor gas is controlled by the MFC 241c, and the is supplied into the process chamber 201 via the nozzle 249a, and the second precursor gas is exhausted via the exhaust pipe 231. In this operation, the second precursor gas is supplied to the wafer 200. At the same time, the valve 243e is opened to allow an inert gas to flow into the gas supply pipe 232e. The flow rate of the inert gas is regulated by the MFC 241e. The inert gas with the regulated flow rate is supplied into the process chamber 201, together with the second precursor gas, and is exhausted via the exhaust pipe 231.

A process condition in this step is exemplified as follows.
Second precursor gas supply flow rate (first flow rate): 1 to 2,000 sccm, specifically 100 to 1,200 sccm
Inert gas supply flow rate: 100 to 40,000 sccm
Each gas supply time: 0.5 to 60 seconds, specifically 1 to 30 seconds
Processing temperature: 400 to 800 degrees C., specifically 500 to 800 degrees C., more specifically 600 to 750 degrees C.
Processing pressure (second pressure): 600 to 1,500 Pa, specifically 700 to 1,000 Pa.

Since a thermal decomposition temperature of the second precursor gas is lower than that of the first precursor gas, the second precursor gas is more easily thermally decomposed than the first precursor gas in step a under the aforementioned condition. Here, in step a, by supplying the first precursor gas of a higher thermal decomposition temperature to the substrate, it is easy to form the first layer of excellent thickness uniformity (that is, the substrate in-plane uniformity and the step coverage) by a surface reaction with the substrate surface while suppressing a gas phase reaction from being generated due to the thermal decomposition of gas molecules contained in the first precursor gas.

Further, the second precursor gas supplied to the substrate in step b is higher in a ratio of Si containing dangling bonds due to the thermal decomposition than that of the first precursor gas, because of its lower thermal decomposition temperature than that of the first precursor gas. Accordingly, the thickness of the second layer is increased, which may make it easy to increase the composition ratio of the predetermined element (Si) in the nitride film (that is, increase a refractive index (RI value) of the nitride film) while improving a film formation rate.

Here, as described above, the second pressure is larger than the first pressure, and at least one selected from the group of the first pressure and the second pressure is determined based on the ratio of the predetermined element in a desired nitride film. That is, by regulating at least one selected from the group of the first pressure and the second pressure, the ratio of the predetermined element (that is, Si) in the nitride film may be set to a desired value.

Further, the ratio of the predetermined element in the desired nitride film may be higher than the ratio of the predetermined element in the stoichiometric composition of the nitride film. For example, when the nitride film is a silicon nitride ($Si_3N_4$) film, the stoichiometric composition of silicon and nitrogen is 3:4, but the ratio of predetermined element (Si) is increased over this ratio (3:4) to obtain the refractive index (RI value). In that case, it may be regulated either in the way of increasing the second pressure or in the way of decreasing the first pressure. For example, by increasing the second pressure, the thickness of the second layer formed on the substrate surface on which the first layer is formed, in other words, the amount of predetermined element, may be increased, and as a result, the ratio of predetermined element contained in the nitride film may be increased. On the other hand, by decreasing the first pressure, the thermal decomposition of the first precursor gas may be suppressed, and accordingly, the first layer of excellent uniformity may be formed by a surface reaction between the substrate surface and the first precursor gas. Further, by decreasing the first pressure, a density of the first layer that may suppress the adsorption of the second precursor gas may be reduced, and as a result, the formation of the second layer by the supply of the second precursor gas may be promoted, thereby increasing the ratio of predetermined element in the nitride film.

Here, the second pressure may be smaller than a pressure under which particles are generated due to the bonding of molecules generated by the thermal decomposition of the second precursor gas in step b. That is, as the thermal decomposition of the second precursor progresses, thermally-decomposed molecules may be bonded to each other, and cluster-like particles in which predetermined elements (Si) are bonded to each other may be generated on the substrate.

Therefore, the second pressure may be smaller than a processing pressure generated by the particles. More specifically, the second precursor gas may be supplied under the pressure condition in which the thermal decomposition is suppressed. In other words, within the range of this condition, the ratio of predetermined element in the nitride film may be maximized by supplying the second precursor gas such that the pressure is as high as possible. This second pressure may be a predetermined pressure in a range of 0.05 Torr (6.7 Pa) to 20 Torr (2,666 Pa) on the assumption that it is higher than the first pressure. Here, when the second pressure is lower than 0.05 Torr, a practical film formation rate may not be obtained, but when it is 0.05 Torr or higher, a nitride film may be formed at a practical film formation rate. On the other hand, when the second pressure exceeds 20 Torr, particles may be generated, but by setting it to 20 Torr or lower, particles may be suppressed from being generated by the bonding of molecules generated by the thermal decomposition of the second precursor in step b.

Further, at least one selected from the group of the first flow rate, which is the supply flow rate of the first precursor gas in step a, and the second flow rate, which is the supply flow rate of the second precursor gas in step b, may be determined based on a desired ratio of predetermined element in the nitride film. In other words, at least one selected from the group of a first partial pressure, which is a partial pressure of the first precursor gas in step a, and a second partial pressure, which is a partial pressure of the second precursor gas in step b, may be determined based on the desired ratio of predetermined element in the nitride film. That is, by regulating at least one selected from the group of the first flow rate (or the first partial pressure) and the second flow rate (or the second partial pressure), the ratio of predetermined element (Si) in the nitride film may become a desired value.

Further, the ratio of predetermined element in the desired nitride film is higher than the ratio of predetermined element in the stoichiometric composition of the nitride film. For example, when the nitride film is silicon nitride ($Si_3N_4$), the stoichiometric composition of silicon and nitrogen is 3:4, but the ratio of predetermined element (Si) is increased over this ratio (3:4) to obtain the refractive index (RI value). In that case, it may be regulated either in the way of increasing the second flow rate or in the way of decreasing the first flow rate. For example, by increasing the second flow rate, the thickness of the second layer formed on the substrate surface on which the first layer is formed, in other words, the amount of predetermined element, may be increased, and as a result, the ratio of predetermined element contained in the nitride film may be increased. On the other hand, by decreasing the first flow rate, the thermal decomposition of the first precursor gas may be suppressed, and accordingly, the first layer having excellent uniformity may be formed by a surface reaction between the substrate surface and the first precursor gas. Further, by decreasing the first flow rate, the density of the first layer that may suppress the adsorption of the second precursor gas may be reduced, and as a result, the formation of the second layer by the supply of the second precursor gas may be promoted, thereby increasing the ratio of predetermined element in the nitride film.

Here, the second flow rate (or the second partial pressure) may be a value smaller than a supply flow rate (or a partial pressure) at which particles are generated due to the bonding of molecules generated by the thermal decomposition of the second precursor gas in step b. That is, as the thermal decomposition of the second precursor progresses, thermally-decomposed molecules may be bonded to each other, and cluster-like particles in which predetermined elements (Si) are bonded to each other may be generated on the substrate. Therefore, the second flow rate may be a value smaller than the supply flow rate (or the partial pressure) at which the particles are generated. This second flow rate (the second partial pressure) may be higher than the first flow rate (the first partial pressure). In other words, the second flow rate (the second partial pressure) may exceed the first flow rate (the first partial pressure) to increase the predetermined element in the nitride film.

From the above, it is possible to cause the second precursor gas to react with the adsorption site on the surface of the wafer 200 remaining without forming the first layer in step a to cause the second precursor gas to be adsorbed on the surface of the wafer 200. On the other hand, since the adsorption site does not exist in a portion where the first layer is formed, the adsorption of Si on the first layer is suppressed. As a result, in this step, the Si-containing layer as the second layer is formed with substantially a uniform thickness based on the first layer formed with substantially a uniform thickness. Cl separated from Si constitutes a gaseous substance such as HCl or $Cl_2$, which is exhausted via the exhaust pipe 231.

After forming the second layer on the wafer 200, the valve 243c is closed to stop the supply of the second precursor gas into the process chamber 201. Then, a gas and the like remaining in the process chamber 201 is removed from the process chamber 201 according to the same processing procedure and process conditions as in the step of removing the residual gas in step a described above.

As the second precursor gas, for example, a halosilane-based gas containing Si as the predetermined element and a halogen element may be used. As the second precursor gas, a chlorosilane-based gas containing the predetermined element, that is Si, such that one Si atom is contained in one molecule and containing no Si—Si bond in the molecule, may be used.

Here, the molecular structure of the second precursor gas may not contain a bond between elements of the predetermined element. The bond between the atoms of the predetermined element referred to here is, for example, a covalent bond between the elements of the predetermined element. For example, when the predetermined element is Si, the bond is Si—Si, and examples of a halosilane-based gas containing such a Si—Si bond may include hexachloridedisilane ($Si_2Cl_6$), pentachlorodisilane ($Si_2HCl_5$), tetrachlorodisilane ($Si_2H_2Cl_4$), trichlorodisilane ($Si_2H_3Cl_3$), and the like. The halosilane gas containing such a Si—Si bond, specifically $Si_2Cl_6$, tends to generate highly-reactive chemical species such as $SiCl_2$ by thermal decomposition, and these chemical species form Si—Si bonds so that Si particles may be easily generated on the substrate. Therefore, from the viewpoint of suppressing the generation of particles, the halosilane gas containing such a Si—Si bond may not be used as the second precursor gas. For example, a gas containing a molecular structure containing one Si atom as a predetermined element, containing a halogen element bonded to this one predetermined element, and further containing hydrogen in this one predetermined element is used as the second precursor gas. As such a second precursor gas, a halosilane gas, specifically a chlorosilane gas, may be used.

As the second precursor gas, for example, a halosilane precursor gas such as a dichlorosilane ($SiH_2Cl_2$) gas, a $SiH_3Cl$ gas, or a $SiHCl_3$ gas may be used. As the second precursor gas, in addition to the chlorosilane-based gas, it may be possible to use, e.g., a fluorosilane-based gas such as a difluorosilane ($SiH_2F_2$) gas, a bromosilane-based gas such as a dibromosilane ($SiH_2Br_2$) gas, or an iodosilane-based gas such as a diiodosilane ($SiH_2I_2$) gas. One or more selected from the group of these gases may be used as the second precursor gas. However, as the second precursor gas, a gas different from the first precursor gas is selected. Further, the second precursor gas may be selected from gases of a lower thermal decomposition temperature (a lower dissociation energy) than that of the first precursor gas.

For example, when the first precursor gas contains a SiCl$_4$ gas, the second precursor gas may contain at least one gas selected from the group of a SiH$_3$Cl gas, a SiHCl$_3$ gas, and a SiH$_2$Cl$_2$ gas.

Further, when the first precursor gas contains a SiHCl$_3$ gas, the second precursor gas may contain a SiH$_2$Cl$_2$ gas.

[Step c]

In this step, a NH$_3$ gas as a nitriding agent is supplied to the wafer 200 in the process chamber 201, that is, a layer formed on the wafer 200 in which the first layer and the second layer are laminated. Specifically, the valve 243b is opened to allow the nitriding agent to flow into the gas supply pipe 232b. A flow rate of the nitriding agent is controlled by the MFC 241b, and the nitriding agent is supplied into the process chamber 201 via the nozzle 249b and is exhausted via the exhaust pipe 231. In this operation, the nitriding agent is supplied to the wafer 200. At the same time, the valve 243d is opened to allow an inert gas to flow through the gas supply pipe 232d. The flow rate of the inert gas is regulated by the MFC 241d. The inert gas with the regulated flow rate is supplied into the process chamber 201, together with the nitriding agent, and is exhausted via the exhaust pipe 231.

A process condition in this step is exemplified as follows.
Nitriding agent supply flow rate: 100 to 10,000 sccm, specifically 1,000 to 5,000 sccm
Inert gas supply flow rate: 100 to 20,000 sccm
Each gas supply time: 1 to 120 seconds, specifically 10 to 60 seconds
Processing temperature: 400 to 800 degrees C., specifically 500 to 800 degrees C., more specifically 600 to 750 degrees C.
Processing pressure: 1 to 4,000 Pa, specifically 10 to 1,000 Pa Under the aforementioned condition, at least a portion of the second layer may be nitrided. A halogen element such as Cl contained in the second layer constitutes a gaseous substance such as HCl and Cl$_2$, which is exhausted via the exhaust pipe 231.

As a result, a nitride layer (SiN layer) containing a predetermined element (Si) and N is formed as a third layer on the wafer 200.

After forming the third layer on the wafer 200, the valve 243b is closed to stop the supply of the nitriding agent into the process chamber 201. Then, a gas and the like remaining in the process chamber 201 is removed from the process chamber 201 according to the same processing procedure and process condition as in the step of removing the residual gas in step a described above.

Further, a hydrogen nitride-based gas may be used as the nitriding agent. The hydrogen nitride-based gas may contain at least one gas selected from the group of an ammonia (NH$_3$) gas, a diazene (N$_2$H$_2$) gas, a hydrazine (N$_2$H$_4$) gas, and a N$_3$H$_8$ gas.

[Substrate Temperature]

In steps a to c described above, the substrate may be heated to 400 to 750 degrees C. Here, when this temperature is higher than 750 degrees C., since the thermal decomposition of the second precursor gas becomes excessive, the above-mentioned particle generation and the deterioration of uniformity are likely to occur. On the other hand, when the temperature is lower than 400 degrees C., since the reaction rate of the first precursor gas or the second precursor gas decreases, a practical film formation rate may not be obtained. Therefore, by setting the temperature to 400 to 750 degrees C., it is possible to form the nitride film at a practical film formation rate while suppressing the above-mentioned particle generation and the deterioration of uniformity.

[Performing Predetermined Number of Times]

By performing a cycle a predetermined number of times (n time, where n is an integer of 1 or more), the cycle including performing the above-described steps a to c, a nitride film (SiN film) having a predetermined composition ratio and a predetermined film thickness may be formed on the wafer 200. The above-described cycle may be performed a plurality of times. That is, by setting the thickness of the nitriding layer formed per cycle to be thinner than a desired film thickness, the above-described cycle may be performed a plurality of times until the film reaches the desired film thickness (After-Purge and Returning to Atmospheric Pressure)

After the above-described film-forming process is completed, an inert gas is supplied into the process chamber 201 from each of the gas supply pipes 232d and 232e and is exhausted via the exhaust pipe 231. Thus, the interior of the process chamber 201 is purged to remove a gas and reaction by-products remaining in the process chamber 201 from the process chamber 201 (after-purge). After that, the internal atmosphere of the process chamber 201 is substituted with the inert gas (inert gas substitution) and the internal pressure of the process chamber 201 is returned to the atmospheric pressure (returning to atmospheric pressure).

(Boat Unloading and Wafer Discharging)

After that, the seal cap 219 is moved down by the boat elevator 115 to open the lower end of the reaction tube 203. Then, the processed wafers 200 supported by the boat 217 are unloaded from the lower end of the reaction tube 203 to the outside of the reaction tube 203 (boat unloading).

After that, the processed wafers 200 are discharged from the boat 217 (wafer discharging).

(3) Effects of the Embodiments

According to the embodiments, one or more effects set forth below may be achieved.

(a) It is possible to suppress the occurrence of the gas phase reaction due to the decomposition (thermal decomposition, etc.) in the gas phase of the first precursor gas by supplying the first precursor gas to the substrate at the first pressure under a low pressure condition, and it is possible to form the first layer of excellent thickness uniformity (substrate in-plane uniformity and step coverage) by forming the first predetermined element (Si)-containing layer (the first layer) by the surface reaction with the substrate surface.

(b) After that, it is possible to form the second predetermined element (Si)-containing layer (the second layer) while maintaining the thickness uniformity, by further supplying the second precursor gas containing a predetermined element to the substrate on which the first layer is formed. At this time, as the supply condition of the second precursor gas, a pressure (processing pressure) in a processing space is increased to the second pressure to promote the decomposition (thermal decomposition, etc.) of the second precursor gas, such that highly-reactive predetermined element (Si)-containing molecules produced by decomposition may be deposited on the substrate surface, thereby increasing the composition ratio of the predetermined element in the nitride film.

(c) Further, since the second precursor gas contains the molecular structure that does not contain the bond between predetermined elements (Si—Si bonds), it is possible to suppress the generation of cluster-like particles caused by the bonding of highly-reactive chemical species (for example, SiCl$_2$) generated by decomposition in the gas phase. Therefore, even when the second precursor gas is supplied under a high pressure condition (or a high partial pressure condition or a high flow rate condition) where the second precursor gas is easily decomposed, it is possible to form the second layer while suppressing the generation of particles.

(4) Others

In the above-described embodiments, the example of forming the SiN film as a nitride film to be formed has been described. The present disclosure is not limited to the above-described embodiments, but may be also suitably applied to, for example, a case of forming an oxide film containing at least one element selected from the group of a metal element and a Group XIV element, as a predetermined element. Here, examples of the metal element may include aluminum (Al), titanium (Ti), zirconium (Zr), hafnium (Hf), molybdenum (Mo), lanthanum (La), and the like. An example of the Group XIV element may include germanium (Ge).

Example

As an Example, by using the substrate processing apparatus shown in FIG. 1, a SiN film is formed on a wafer in the substrate processing process of (2). Specifically, a SiCl$_4$ gas is used as the first precursor gas, a SiH$_2$Cl$_2$ gas is used as the second precursor gas, and a NH$_3$ gas is used as the nitriding agent. As the main process condition, the processing temperature is set to 650 degrees C. through steps a to c, and the other process conditions are set to predetermined conditions within the process condition range disclosed in the above-described embodiments, and with these process conditions, the wafer is subjected to a film-forming process being performed a predetermined number of cycles.

Table 1 below shows measured values on the wafer obtained as a result. "Plane uniformity" indicates a ratio of distance between the highest point and the lowest point in a nitride film to an average film thickness (unit: ×10$^{-1}$ nm).

TABLE 1

| Average film thickness (×10$^{-1}$ nm) | 102.9 |
|---|---|
| Plane uniformity (%) | 4.76 |
| Refractive index | 2.105 |
| The number of particles | 0 |

As described above, the wafer of the Example is excellent in the step coverage characteristics and the wafer in-plane film thickness uniformity, and may realize a high refractive index (RI) without generating particles. That is, as shown by the high refractive index, a high Si content ratio in the nitride film may be realized.

When a Si$_2$Cl$_6$ gas is used instead of the SiH$_2$Cl$_2$ gas as the second precursor gas under the same condition as described above, the range of RI obtained in a range where particles are not generated remains at 2.02 to 2.03. That is, when the SiH$_2$Cl$_2$ gas is used as the second precursor gas as in the Example, it is confirmed that it is possible to increase the Si content ratio in the nitride film over when the Si$_2$Cl$_6$ gas is used as the second precursor gas, without generating particles.

According to some embodiments of the present disclosure, it is possible to provide a technique capable of forming a film containing a predetermined element on a pattern on a substrate with excellent uniformity while suppressing particles containing the predetermined element from being formed on the substrate.

While certain embodiments have been described, these embodiments have been presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   forming a nitride film containing silicon on the substrate by performing a cycle a predetermined number of times, the cycle including sequentially performing:
   (a) supplying a first precursor gas containing a molecular structure containing silicon to the substrate with a pressure of a processing space where the substrate is placed being set to a first pressure;
   (b) supplying a second precursor gas, which is different from the first precursor gas, to the substrate with the pressure of the processing space being set to a second pressure higher than the first pressure, wherein the second precursor gas contains a molecular structure containing silicon and not containing a silicon-silicon bond; and
   (c) supplying a nitriding agent to the substrate,
   wherein at least one selected from the group of a first flow rate, which is a supply flow rate of the first precursor gas in (a), and a second flow rate, which is a supply flow rate of the second precursor gas in (b), is determined based on a desired ratio of silicon in the nitride film, and
   wherein the second flow rate is larger than the first flow rate.

2. The method of claim 1, wherein a thermal decomposition temperature of the second precursor gas is lower than that of the first precursor gas.

3. The method of claim 1, wherein at least one selected from the group of the first pressure and the second pressure is determined based on a desired ratio of silicon in the nitride film.

4. The method of claim 3, wherein the desired ratio of silicon to nitrogen in the nitride film is larger than a ratio of silicon to nitrogen in stoichiometric composition of a silicon nitride film.

5. The method of claim 3, wherein the second pressure is smaller than a pressure under which particles are generated due to bonding of molecules generated by thermal decomposition of the second precursor gas in (b).

6. The method of claim 1, wherein the desired ratio of silicon to nitrogen in the nitride film is larger than a ratio of silicon to nitrogen in stoichiometric composition of a silicon nitride film.

7. The method of claim 1, wherein the second flow rate is smaller than a supply flow at which particles are generated due to bonding of molecules generated by thermal decomposition of the second precursor gas in (b).

8. The method of claim 1, wherein the first precursor gas contains a molecular structure containing a halogen element bonded to a silicon atom.

9. The method of claim 1, wherein in (a), a layer containing silicon is discontinuously formed on a surface of the substrate.

10. The method of claim 9, wherein in (a), a coverage of the layer containing silicon on the surface of the substrate is less than 70%.

11. The method of claim 8, wherein the first precursor gas is a halosilane gas.

12. The method of claim 11, wherein the first precursor gas is a chlorosilane gas.

13. The method of claim 1, wherein the second precursor gas contains a molecular structure containing one silicon atom.

14. The method of claim 1, wherein the second precursor gas contains a molecular structure containing a halogen element bonded to a silicon atom.

15. The method of claim 14, wherein the second precursor gas contains a molecular structure containing hydrogen bonded to a silicon atom.

16. The method of claim 14, wherein the second precursor gas is a halosilane gas.

17. The method of claim 16, wherein the second precursor gas is a chlorosilane gas.

18. The method of claim 1, wherein the second precursor gas includes at least one selected from the group of a monochlorosilane gas, a dichlorosilane gas, and a trichlorosilane gas.

19. The method of claim 18, wherein the first precursor gas includes a tetrachlorosilane gas.

20. The method of claim 1, wherein the nitriding agent is a hydrogen nitride-based gas.

21. A substrate processing apparatus comprising:
a controller configured to be capable of controlling a first precursor gas supply system, a second precursor gas supply system, and a nitriding agent supply system to perform the method of claim 1;
the first precursor gas supply system configured to supply the first precursor gas to the substrate;
the second precursor gas supply system configured to supply the second precursor gas to the substrate; and
the nitriding agent supply system configured to supply the nitriding agent to the substrate.

22. A method of manufacturing a semiconductor device, comprising:
forming a nitride film containing silicon on a substrate by performing a cycle a predetermined number of times, the cycle including sequentially performing:
(a) supplying a first precursor gas containing a molecular structure containing silicon to the substrate with a pressure of a processing space where the substrate is placed being set to as a first pressure;
(b) supplying a second precursor gas, which is different from the first precursor gas, to the substrate with the pressure of the processing space being set to a second pressure higher than the first pressure, wherein the second precursor gas contains a molecular structure containing silicon and not containing a silicon-silicon bond; and
(c) supplying a nitriding agent to the substrate,
wherein at least one selected from the group of a first flow rate, which is a supply flow rate of the first precursor gas in (a), and a second flow rate, which is a supply flow rate of the second precursor gas in (b), is determined based on a desired ratio of silicon in the nitride film, and
wherein the second flow rate is larger than the first flow rate.

23. A non-transitory computer-readable recording medium storing a program that causes, by a computer, a substrate processing apparatus to perform a process comprising:
forming a nitride film containing silicon on a substrate by performing a cycle a predetermined number of times, the cycle including sequentially performing:
(a) supplying a first precursor gas containing a molecular structure containing silicon to the substrate with a pressure of a processing space where the substrate is placed being set to a first pressure;
(b) supplying a second precursor gas, which is different from the first precursor gas, to the substrate with the pressure of the processing space being set to as a second pressure higher than the first pressure, wherein the second precursor gas contains a molecular structure containing silicon and not containing a silicon-silicon bond; and
(c) supplying a nitriding agent to the substrate,
wherein at least one selected from the group of a first flow rate, which is a supply flow rate of the first precursor gas in (a), and a second flow rate, which is a supply flow rate of the second precursor gas in (b), is determined based on a desired ratio of silicon in the nitride film, and
wherein the second flow rate is larger than the first flow rate.

* * * * *